INVENTOR
M. UENOHARA
BY Roderick B. Anderson
ATTORNEY 3,451,011

TWO-VALLEY SEMICONDUCTOR DEVICES AND CIRCUITS

Michiyuki Uenohara, Scotch Plains, N.J., assignor to Bell Telephone Laboratories, Incorporated, Murray Hill and Berkeley Heights, N.J., a corporation of New York Filed Sept. 22, 1967, Ser. No. 669,844
Int. Cl. H03b 5/12, 5/24, 5/36
U.S. Cl. 331—107 13 Claims

ABSTRACT OF THE DISCLOSURE

A slot extending into a two-valley semiconductor sample divides the sample into two active regions, a major section and a control section. The control section is of smaller cross-sectional area than the major section and is isolated from it by a radio frequency shield extending into the slot. A radio-frequency signal which extends periodically above the threshold voltage and below the domain sustaining voltage is applied between opposite contacts of the control section and amplified signal power is derived from the major section. In another embodiment, oscillation energy from the major section is fed back to the control section on a variable delay line that can be used to control output frequency.

*Background of the invention*

The basic theroy in operation of two-valley semiconductors is set forth in detail in a number of papers in a special issue on such devices of the IEEE Transactions on Electron Devices, January 1966. As explained in these papers, a negative resistance can be obtained from an appropriate semiconductor sample of substantially homogeneous consituency having two energy band "valleys" within the conduction band which are separated by only a small energy difference. By establishing a suitably high electric field across opposite ohmic contacts of the semiconductor sample, oscillations can be induced which result from the formation of discrete regions of high electric field intensity or domains that travel from the negative or cathode contact to the positive or anode contact at approximately the carrier drift velocity.

The copending application of Uenohara, Ser. No. 542,168, filed Apr. 12, 1966, points out that two-valley semiconductors of uniform crystal structure, cross-sectional area and doping level have three characteristic voltage parameters: the oscillation threshold voltage $V_T$, the oscillation sustaining voltage $V_S$, and the domain sustaining voltage $V_D$. When the voltage across the sample reaches the threshold voltage $V_T$, a high field domain is formed which restricts current flow through the device to almost a steady value regardless of increases in voltage. After a domain is extinguished at the anode, a new domain will be formed if the voltage across the sample is above thet sustaining voltage of oscillation $V_S$, which is typically about 95 percent of the threshold voltage $V_T$. Once a domain has been formed, it will not be extinguished before it reaches the anode unless the applied voltage across the sample falls below the domain sustaining voltage $V_D$.

In its most common use as an oscillator, a two-valley semiconductor diode is biased above the threshold voltage and connected through a resonant tank circuit to a load. The successively formed electric field domains that travel between the cathode and anode contacts of the diode generate current pulses in the circuit that are converted by the resonant tank circuit into sinusoidal oscillations. Since the domains are formed successively, the generated pulse frequency is approximately equal to the domain drift velocity divided by the sample length. While the output frequency can be varied somewhat by tuning the tank circuit, this tends to cause impedance mismatches with the load.

Although the negative resistance obtainable within two-valley semiconductor samples can be used for generating oscillations, it is difficult to use these devices as amplifiers. Techniques for using two-valley devices as amplifiers are described in the copending applications of Hakki et al., Ser. No. 632,102, filed Apr. 19, 1967, and H. W. Thim, Ser. No. 605,644, filed Dec. 29, 1966, both of which are assigned to Bell Telephone Laboratories, Incorporated.

*Summary of the invention*

The present invention is predicated on the discovery that if two discrete active regions of a semiconductor sample share a common cathode contact, then one of the regions can be used to control domain formation and domain quenching in the other region. For example, in one embodiment, a slot extends into a two-valley semiconductor sample to divide it into the two active sections, a major section and a control section. A cathode contact and part of the semiconductor on one side of the sample is common to both active sections, with separate anode contacts for each of the two sections included on the other side of the sample. If the sample is biased at a voltage between the domain sustaining voltage $V_D$ and the threshold voltage $V_T$, then a voltage applied to the control section which is above $V_T$ will excite a high field domain that travels through both sections, and a control section voltage that extends below the domain sustaining voltage will quench domains in both sections. Hence, a signal output to the control section that extends periodically above $V_T$ and below $V_D$ can be used to control the frequency output from the major section. The input circuit is isolated from the output circuit so that signal frequency changes do not affect load circuit characteristics.

In an illustrative embodiment, the cross-sectional area of the major section is larger than that of the control section. Since the current through each section is proportional to its area, a relatively low power signal input across the control section can be used to control relatively large currents in the major section. As a result, the output power from the larger region is of the same frequency as the input signal but of higher power, thus giving power amplification.

In another embodiment, the control section is used to trigger traveling domains in the major section, with part of the output from the major section being fed back to the control section through a delay line. Each output pulse from the major section is delayed for a prescribed period of time before being fed back to the control section to excite a new traveling domain. Thus, the output frequency of the major section is reduced to a value determined by the delay of the delay line. By making this delay variable, one can control the output frequency of the major section without using a signal locking frequency as described before.

*Drawing description*

These and other objects, features, embodiments and advantages of the invention will be better understood from a consideration of the following detailed description taken in conjunction with the accompanying drawing in which.

*Detailed description*

Figure 1:
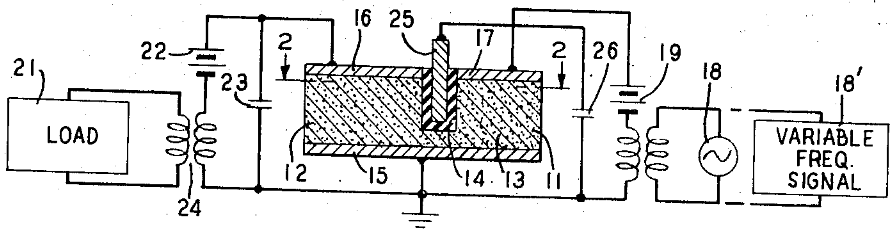
FIG. 1 is a schematic diagram of one embodiment of the invention.
Figure 2:
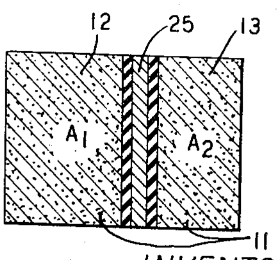
FIG. 2 is a sectional view taken along lines 2—2 of FIG. 1.

Referring now to FIGS. 1 and 2, there is shown an illustrative embodiment of the invention comprising a sample 11 of substantially homogeneous semiconductor material which is capable of exhibiting two-valley characteristics, as for example, n-type gallium arsenide having a doping level of $10^{13}$ to $10^{16}$ carriers per cubic centimeter. The sample 11 is divided into a major section 12 and a control section 13 by a slot 14 which preferably extends more than half-way into the sample, but does not reach the cathode 15. The major section 12 and the control section 13 have a common cathode contact 15 and separate anode contacts 16 and 17.

An input circuit comprises an R-F voltage source 18 and a bias source 19 connected to the cathode contact 15 and anode contact 17 of the control section 13. An output circuit connected between the cathode contact and anode contact 16 comprises a load 21, a bias source 22, and a resonant circuit including a capacitor 23 and output transformer 24. The input circuit is isolated from the output circuit by a conductive R-F shield 25 connected by way of a capacitor 26 to the cathode contact 15. The R-F shield 25 is insulated from the semiconductor sample 11 as shown in the drawing.

In accordance with the invention, batteries 19 and 22 bias both the major section 12 and the control section 13 of the semiconductor sample at a voltage that is between the domain sustaining voltage $V_D$ and the threshold voltage of oscillation $V_T$. As a consequence, signal voltages superposed on the bias voltage applied to the control section can be used to control the formation and quenching of high field domains in the major section 12, and therefore the current that flows in the output circuit. This can be appreciated by considering the following:

It is characteristic of two-valley semiconductor samples that when the voltage between opposite contacts exceeds the threshold voltage $V_T$, a high field domain is nucleated at or near the cathode contact which proceeds to travel toward the anode. Since the device of FIG. 1 is biased at a voltage between $V_D$ and $V_T$, the device is stable without an input signal. When the signal is applied between the contacts 17 and 15, a high field domain is nucleated at or near the cathode contact at the instant that the signal voltage exceeds $V_T$. In accordance with the known "two-valley" model, the domain grows very rapidly while traveling toward the anode. Since the electric field in the entire sample near the cathode is higher than the domain sustaining electric field $E_D$, the domain extends almost instantly into the major section 12. The domain in the major section grows and travels in synchronism with that in the control section.

If the applied voltage across the control section 13 falls below the domain sustaining voltage $V_D$ before the domain reaches the anode, the domain in section 13 disappears very rapidly, and the field outside the domain increases. This results in an increase of the field behind the domain in major section 12—a condition incompatible with the existence of the domain—and tends to quench the domain in the major section. Moreover, since the output circuit is tuned approximately at the input frequency, the terminal voltage across the contacts 16 and 15 also changes in synchronism with that between the contacts 17 and 15. The rapid reduction of terminal voltage also tends to quench the domain in the major section. As a consequence the domain in section 12 is extinguished almost instantaneously with the extinguishing of the domain in section 13.

As is known, when a domain is present in a two-valley semiconductor diode, the current flowing through the device is substantially constant regardless of applied voltage. As a result, the formation and quenching of the domains in the major section 12 of the device of FIG. 1 has a gating action on current which is directed to the load 21.

In accordance with another feature of the invention, the cross-sectional area in a plane parallel to the cathode contact of the major section 12 is larger than the cross-sectional area of the control section 13. Referring to FIG. 2, the area $A_1$ of control section 12 is larger than the area $A_2$ of the control section 13. As such, the current controlled in major section 12 is larger than the current required for controlling it in the control section 13. Hence, the output power delivered to the load is an amplified function of the input power, and the device acts as a power amplifier.

Figure 3A:
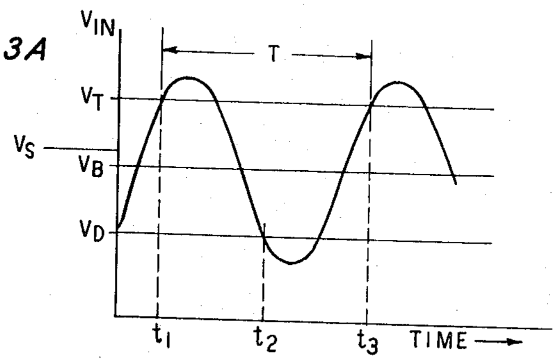
FIG. 3A is a graph of input voltage versus time in the two-valley semiconductor device of FIG. 1.
Figure 3B:
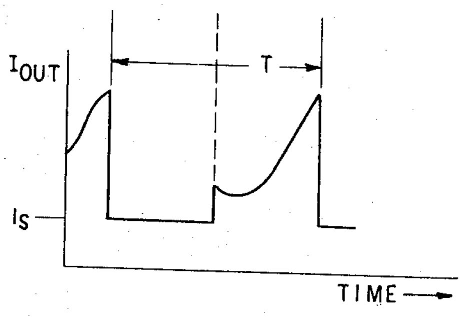
FIG. 3B is a graph of output current versus time in the device of FIG. 1.

The operation of the device of FIG. 1 may be better understood from a consideration of FIG. 3A which is a graph of input voltage $V_{in}$ across the control section versus time, and FIG. 3B, which is a graph of output current $I_{out}$ derived from the major section, neglecting the effect of the output tank circuit; that is, FIG. 3B is a graph of what the output current would be in the absence of a tank circuit in the output circuit. As mentioned before, both of the battery voltages are at a value between the domain sustaining voltage $V_D$ and the threshold voltage $V_T$, although both battery voltages need not be identical.

As shown in FIG. 3A, the superposed signal voltage in the input circuit reaches the threshold voltage $V_T$ at time $t_1$, thereby triggering a high intensity domain in both the control section and the major section. Hence, at time $t_1$ the output current from the major section drops to a steady state value $i_s$, at which value the output current remains during the transit of the domain. At time $t_2$, however, the signal voltage in the input circuit falls to the value $V_D$ which extinguishes the high field domains in both the control and major sections. As a result, the output current of FIG. 3B immediately rises and thereafter follows the input voltage until the input voltage again reaches the threshold value $V_T$ at time $t_3$, and the cycle then repeats.

The graphs of FIGS. 3A and 3B illustrate how high intensity domains in the major section are excited and extinguished by the signal voltage across the control section. The large current drop of FIG. 3B at time $t_1$ is a manifestation of the negative resistance of the sample when biased beyond threshold. Because of the relatively larger current in the major section of the sample than in the control section, the current fluctuations in the output circuit represent a power amplification of relatively small input signals to the control section. It is to be understood, however, that, with the tank circuit in the output circuit, the actual current delivered to the load has a sinusoidal form rather than the wave form shown in FIG. 3B.

The D-C bias voltages across both sections should be smaller than the oscillation sustaining voltage $V_S$ so that when the input signal is removed, all oscillation in the device will stop.

Another characteristic of the circuit of FIG. 1 is that the output frequency follows the input signal frequency; that is, the period T of the output current of FIG. 3B is equal to the period T of the input signal of the FIGURE 3A. The major section 12 may therefore be considered as an oscillator which is frequency locked by the input signal frequency. As shown in FIG. 1, a rather large output oscillation frequency can therefore be varied by using a variable frequency source 18' for supplying the superposed signal to the control section, and the device may be considered as being a variable frequency oscillator.

The purpose of the conductive shield 25 of FIG. 1 is to prevent feedback of R-F energy in the major section 12 to the control section 13. R-F energy in the shield 25 is conducted to R-F ground through capacitor 26. With this provision the input circuit is isolated from the outout circuit and changes of the input signal power or frequency do not affect the load circuit characteristics; this is an advantage with respect to certain prior variable frequency two-valley oscillators.

Figure 4:
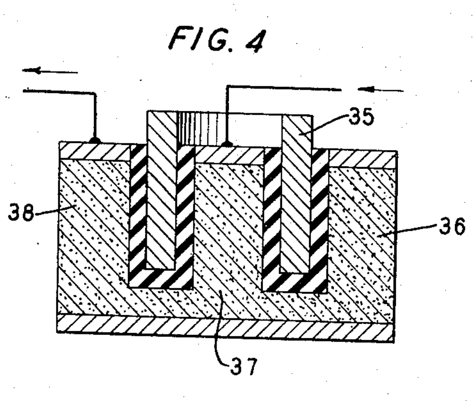
FIG. 4 is a schematic illustration of another embodiment of the invention.
Figure 5:
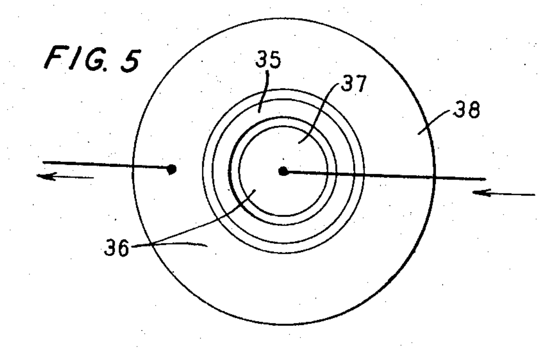
FIG. 5 is a top view of the two-valley semiconductor device of FIG. 4.

FIGS. 4 and 5 show an alternative construction of the two-valley semiconductor device in which a cylindrical R-F shield 35 is inserted in a cylindrical slot in sample 36. The central portion of the sample then constitutes the control section 37 to which an input signal is applied and the outer region of the sample constitutes the major section 38 from which output current is derived. This embodiment has the advantage of being symmetrical and amenable to conventional semiconductor construction techniques.

Figure 6:
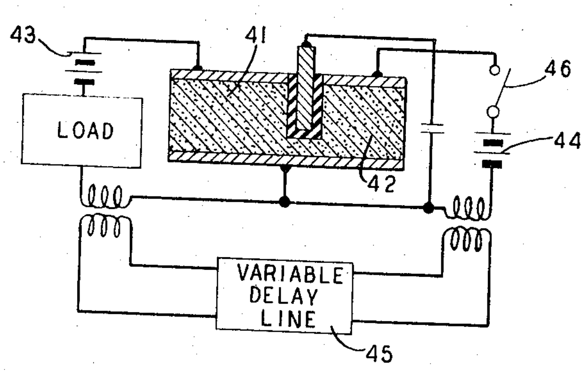
FIG. 6 is a schematic view of still another embodiment of the invention.

Referring to FIG. 6, there is shown a variable frequency oscillator in accordance with another embodiment of my invention which does not require a variable frequency input signal as in FIG. 1. As before, the semiconductor sample is divided into a major section 41 and a control section 42 which are biased by batteries 43 and 44 at a direct current voltage between the domain sustaining voltage $V_D$ and the threshold voltage $V_T$. A variable delay line 45 couples part of the output power into the input circuit. The circuit is designed to operate continuously in response to closure of switch 46.

Figure 7A:
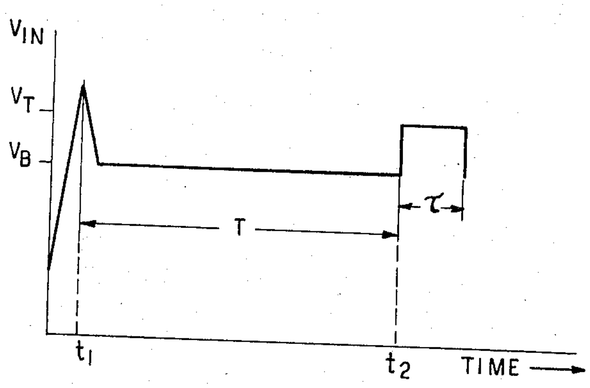
FIG. 7A is a graph of input voltage versus time in the two-valley semiconductor device of FIG. 6.
Figure 7B:
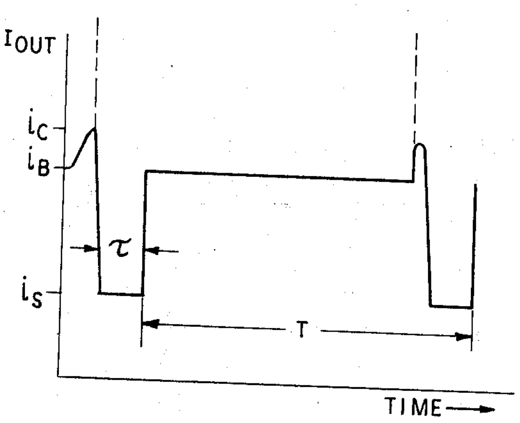
FIG. 7B is a graph of output current versus time in the device of FIG. 6.

Referring to FIG. 7A, which is a graph of input voltage $V_{in}$ across the control section versus time, the rise in voltage at time $t_1$ indicates the voltage transients resulting from closure of switch 46. This voltage, which extends momentarily above $V_T$, triggers a domain at time $t_1$ in the major section 41 causing a current drop in the output circuit as shown in FIG. 7B. The current drop extends for a time $\tau$ equal to the time required for the domain to traverse the major section. When the domain reaches the anode, a new domain is not formed because the control section voltage is below $V_T$.

After a time T, which is equal to the delay supplied by the variable delay line 45, the current pulse which is shown in FIG. 7B at time $t_1$, is fed back to the input circuit and superposed on the voltage $V_B$ supplied by battery 44. The resulting voltage pulse across the control section at time $t_2$ triggers another domain in the major section thereby causing another current pulse in the output as before. This process repeats itself, yielding output pulses of width $\tau$ and period T as shown in FIG. 7B.

Since the period T of the output pulses directed to the load of FIG. 6 is equal to the time delay of delay line 45, one can vary the output frequency delivered to the load by varying the delay of delay line 45. Since the period T of generated pulses in the device of FIG. 6 is longer than the domain transit time $\tau$, the circuit is particularly useful where pulse repetition rates are required that are smaller than the pulse repetition rates of conventional two-valley devices. It should be noted parenthetically that the period of conventional two-valley oscillators is equal to $\tau$.

The use of transient current resulting from the closure of switch 46 for triggering sustained oscillations in the circuit of FIG. 6 is convenient for simplifying circuit design, but it requires the battery voltage $V_B$ be sufficiently close to $V_T$ so that the transient voltage exceeds $V_T$. For some purposes it may be more convenient to use an external source for applying a trigger pulse to initiate oscillation, rather than depending on circuit transients as described before.

From the foregoing it is clear to those skilled in the art that the invention described is useful for purposes other than those specifically enumerated. For example, the circuit of FIG. 6 could be used as a memory device in which an oscillating or "ON" condition indicates the storage of a "1" digit and an "OFF" condition indicates the storage of a "0" digit. Positively extending and negatively extending pulses could be used for switching the device to either the "ON" or "OFF" condition. Various other embodiments and modifications may be devised by those skilled in the art without departing from the spirit and scope of the invention.

What is claimed is:

1. In combination:

a two-valley semiconductor device comprising a sample of two-valley semiconductor material contained between a first contact and second and third contacts, said semiconductor material having an inherent threshold voltage of oscillation $V_T$ and a domain sustaining voltage $V_D$;

means for biasing the second contact at a voltage with respect to the first contact which is above the domain sustaining voltage $V_D$ but below the threshold voltage $V_T$;

means for applying between the first and third contacts a voltage that periodically extends above the threshold voltage $V_T$;

and means for deriving output power from the second contact;

2. The combination of claim 1 wherein:

the second and third contacts are both substantially parallel to the first contact;

and the contact area of the second contact with the semiconductor is greater than the contact area of the third contact with the semiconductor, whereby the output power is an amplified function of the input power.

3. The combination of claim 1 wherein:

the portion of the sample between the first and second contacts constitutes a first semiconductor section which is part of an output circuit and the portion of the sample between the first and third contacts constitutes a second semiconductor section which is part of an input circuit;

and further comprising means for isolating the input circuit from the output circuit comprising means for providing radio frequency shielding of a major part of the second semiconductor section from the first semiconductor section.

4. The combination of claim 1 wherein:

the biasing means comprises means for applying a voltage between the first and second contacts that is below the oscillation sustaining voltage of the sample.

5. The combination of claim 1 wherein:

the voltage applying means comprises means for applying between the first and third contacts a voltage that periodically extends above the threshold $V_T$ and below the domain sustaining voltage $V_D$.

6. The combination of claim 1 wherein:

the means for applying a voltage between the first and third contacts comprises means for feeding back a portion of the output power and applying it between the first and third contacts.

7. The combination of claim 6 wherein:

the feedback means comprises a variable delay line.

8. In combination:

a two-valley semiconductor device comprising a major section and a control section;

the major section comprising a first two-valley semiconductor sample portion contained between a cathode contact and a first anode contact;

the control section comprising a second two-valley semiconductor sample portion contained between said cathode contact and a second anode contact;

and means for controlling the propagation of high field domains in the major section comprising means for applying a control voltage across the control section.

9. The combination of claim 8 wherein:
the major section and the control section are part of a single two-valley semiconductor sample having a slot which separates the major and control sections.

10. The combination of claim 9 wherein:
the slot extends more than half the distance, but less than the entire distance, through the sample.

11. The combination of claim 8 wherein:
the control voltage periodically extends above the oscillation threshold voltage of the sample and below the domain sustaining voltage of the sample.

12. The combination of claim 8 further comprising:
a load;
means for delivering power from the major section to the load;

and wherein the control voltage applying means comprises means for deriving power from the major section and feeding it back to said control section.

13. The combination of claim 12 wherein:
the control voltage applying means includes a variable delay line for controlling the delay of power feedback from the major section of the control section.

References Cited

UNITED STATES PATENTS 3,365,583 1/1968 Gunn -------------- 331—107

JOHN KOMINSKI, *Primary Examiner.*

U.S. Cl. X.R.

317—234; 332—16; 330—5